United States Patent
Fu et al.

(10) Patent No.: US 9,461,189 B2
(45) Date of Patent: Oct. 4, 2016

(54) PHOTOVOLTAIC DEVICES WITH ELECTROPLATED METAL GRIDS

(71) Applicant: Silevo, Inc., Fremont, CA (US)

(72) Inventors: Jianming Fu, Palo Alto, CA (US); Jiunn Benjamin Heng, San Jose, CA (US); Christopher J. Beitel, Los Altos, CA (US); Zheng Xu, Pleasanton, CA (US)

(73) Assignee: SolarCity Corporation, San Mateo, CA (US)

( * ) Notice: Subject to any disclaimer, the term of this patent is extended or adjusted under 35 U.S.C. 154(b) by 387 days.

(21) Appl. No.: 14/045,163

(22) Filed: Oct. 3, 2013

(65) Prior Publication Data
US 2014/0096823 A1  Apr. 10, 2014

Related U.S. Application Data

(60) Provisional application No. 61/709,798, filed on Oct. 4, 2012.

(51) Int. Cl.
*H01L 31/0224* (2006.01)
*H01L 31/18* (2006.01)
(Continued)

(52) U.S. Cl.
CPC ............ *H01L 31/022433* (2013.01); *H01L 31/022425* (2013.01); *H01L 31/0684* (2013.01); *H01L 31/0747* (2013.01); *H01L 31/1804* (2013.01); *Y02E 10/547* (2013.01)

(58) Field of Classification Search
CPC .......... H01L 31/1804; H01L 31/0747; H01L 31/06384; H01L 31/022425; H01L 31/022433; Y02E 10/547
USPC .................. 136/244, 251, 252, 256
See application file for complete search history.

(56) References Cited

U.S. PATENT DOCUMENTS 2,626,907 A   1/1953   Melvin De Groote
2,938,938 A   5/1960   Dickson
(Continued)

FOREIGN PATENT DOCUMENTS

CN   100580957 C   1/2010
CN   104409402     3/2015
(Continued)

OTHER PUBLICATIONS

Beaucarne G et al: 'Epitaxial thin-film Si solar cells' Thin Solid Films, Elsevier-Sequoia S.A. Lausanne, CH LNKD—DO1:10. 1016/J.TSF.2005.12.003, vol. 511-512, Jul. 26, 2006, pp. 533-542, XP025007243 ISSN: 0040-6090 [retrieved on Jul. 26, 2006].
(Continued)

*Primary Examiner* — Susan D Leong
(74) *Attorney, Agent, or Firm* — Shun Yao; Park, Vaughan, Fleming & Dowler LLP (57) ABSTRACT

One embodiment of the present invention provides a solar cell. The solar cell includes a photovoltaic structure and a front-side metal grid situated above the photovoltaic structure. The front-side metal grid also includes one or more electroplated metal layers. The front-side metal grid includes one or more finger lines, and each end of a respective finger line is coupled to a corresponding end of an adjacent finger line via an additional metal line, thus ensuring that the respective finger line has no open end.

18 Claims, 6 Drawing Sheets

(51) Int. Cl.
*H01L 31/068* (2012.01)
*H01L 31/0747* (2012.01)

(56) References Cited

U.S. PATENT DOCUMENTS

| | | |
|---|---|---|
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,633,033 A | 12/1986 | Nath |
| 4,652,693 A | 3/1987 | Bar-On |
| 4,667,060 A | 5/1987 | Spitzer |
| 4,670,096 A | 6/1987 | Schwirtlich |
| 4,694,115 A | 9/1987 | Lillington |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 5,053,355 A | 10/1991 | von Campe |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,441,297 B1 | 8/2002 | Keller |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,168,880 B2 | 5/2012 | Jacobs |
| 8,182,662 B2 | 5/2012 | Crowley |
| 8,209,920 B2 | 7/2012 | Krause |
| 8,222,513 B2 | 7/2012 | Luch |
| 8,222,516 B2 | 7/2012 | Cousins |
| 8,343,795 B2 | 1/2013 | Luo |
| 8,586,857 B2 | 11/2013 | Everson |
| 2001/0008143 A1 | 7/2001 | Sasaoka |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2005/0012095 A1 | 1/2005 | Niira |
| 2005/0022861 A1 | 2/2005 | Rose |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |

(56) References Cited

U.S. PATENT DOCUMENTS

| | | |
|---|---|---|
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0149161 A1 | 6/2008 | Nishida |
| 2008/0156370 A1 | 7/2008 | Abdallah |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0139512 A1 | 6/2009 | Lima |
| 2009/0151783 A1 | 6/2009 | Lu |
| 2009/0155028 A1 | 6/2009 | Boguslavskiy |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0169478 A1 | 7/2010 | Saha |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0269904 A1 | 10/2010 | Cousins |
| 2010/0279492 A1 | 11/2010 | Yang |
| 2010/0300506 A1 | 12/2010 | Heng et al. |
| 2010/0300507 A1 | 12/2010 | Heng |
| 2010/0313877 A1 | 12/2010 | Bellman |
| 2011/0146781 A1 | 6/2011 | Laudisio |
| 2011/0156188 A1 | 6/2011 | Tu |
| 2011/0168250 A1 | 7/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277825 A1 | 11/2011 | Fu et al. |
| 2011/0297224 A1 | 12/2011 | Miyamoto |
| 2011/0297227 A1 | 12/2011 | Pysch |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0073975 A1 | 3/2012 | Ganti |
| 2012/0085384 A1 | 4/2012 | Beitel |
| 2012/0125391 A1 | 5/2012 | Pinarbasi |
| 2012/0152349 A1 | 6/2012 | Cao |
| 2012/0192932 A1 | 8/2012 | Wu et al. |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0325282 A1 | 12/2012 | Snow |
| 2013/0000705 A1 | 1/2013 | Shappir |
| 2013/0014802 A1 | 1/2013 | Zimmerman |
| 2013/0096710 A1 | 4/2013 | Pinarbasi |
| 2013/0152996 A1 | 6/2013 | DeGroot |
| 2013/0206213 A1 | 8/2013 | He |
| 2013/0206221 A1 | 8/2013 | Gannon |
| 2013/0247955 A1 | 9/2013 | Baba |
| 2013/0269771 A1 | 10/2013 | Cheun |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0345674 A1 | 11/2014 | Yang |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |

FOREIGN PATENT DOCUMENTS

| | | |
|---|---|---|
| DE | 4030713 | 4/1992 |
| DE | 102012010151 | 11/2013 |
| EP | 1770791 | 4/2007 |
| EP | 1806684 | 8/2007 |
| EP | 2362430 | 8/2011 |
| EP | 2385561 A2 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | H04245683 A | 9/1992 |
| JP | H07249788 A | 9/1995 |
| JP | 2002057357 A | 2/2002 |
| JP | 2005159312 A | 6/2005 |
| JP | 2009177225 | 8/2009 |
| KR | 20050122721 A | 12/2005 |
| KR | 20060003277 A | 1/2006 |

(56) References Cited

FOREIGN PATENT DOCUMENTS

| | | |
|---|---|---|
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009150654 | 12/2009 |
| WO | 2009150654 A2 | 12/2009 |
| WO | 2010075606 A1 | 7/2010 |
| WO | 2010104726 A2 | 9/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 A1 | 2/2013 |
| WO | 2010085949 | 3/2013 |
| WO | 2014074826 | 7/2014 |
| WO | 2014110520 | 7/2014 |

OTHER PUBLICATIONS

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%201.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of the IEEE Photovoltaic Specialists Conference, May 6, 1975, pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heteroj unction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. SUPPL. 19-01, Jan. 1, 1980, pp. 539-544, XP008036363 ISSN: 0021-4922.

WP Leroy et al., "In Search for the Limits of Rotating Cylindrical Magnetron Sputtering", Magnetron, ION Processing and ARC Technologies European Conference, Jun. 18, 2010, pp. 1-32.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011, p. 78402, XP020207379, ISSN: 1674-1056, DOI: 10.1088/1674-1056/20/7/078402.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

PHOTOVOLTAIC DEVICES WITH ELECTROPLATED METAL GRIDS

RELATED APPLICATION

This application claims the benefit of U.S. Provisional Application No. 61/709,798, entitled "PHOTOVOLTAIC DEVICES WITH COPPER GRIDS," by inventors Jianming Fu, Chentao Yu, Jiunn Benjamin Heng, Christopher J. Beitel, and Zheng Xu, filed 4 Oct. 2012.

BACKGROUND

1. Field

This disclosure is generally related to solar cells. More specifically, this disclosure is related to a solar cell that includes a metal grid fabricated by an electroplating technique.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photovoltaic effect. There are several basic solar cell structures, including a single p-n junction solar cell, a p-i-n/n-i-p solar cell, and a multi-junction solar cell. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal bandgaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction, generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Figure 1:
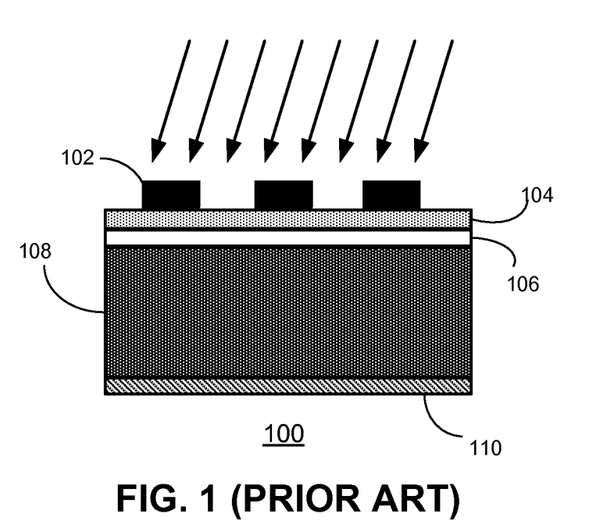
FIG. 1 presents a diagram illustrating an exemplary solar cell (prior art).

FIG. 1 presents a diagram illustrating an exemplary homojunction solar cell based on a crystalline-Si (c-Si) substrate (prior art). Solar cell 100 includes a front-side Ag electrode grid 102, an anti-reflection layer 104, an emitter layer 106, a substrate 108, and an aluminum (Al) back-side electrode 110. Arrows in FIG. 1 indicate incident sunlight.

In conventional c-Si based solar cells, the current is collected by front-side Ag grid 102. To form Ag grid 102, conventional methods involve printing Ag paste (which often includes Ag particle, organic binder, and glass frit) onto the wafers and then firing the Ag paste at a temperature between 700° C. and 800° C. The high-temperature firing of the Ag paste ensures good contact between Ag and Si, and lowers the resistivity of the Ag lines. The resistivity of the fired Ag paste is typically between $5 \times 10^{-6}$ and $8 \times 10^{-6}$ ohm-cm, which is much higher than the resistivity of bulk silver.

In addition to the high series resistance, the electrode grid obtained by screen-printing Ag paste also has other disadvantages, including higher material cost, wider line width, and limited line height. As the price of silver rises, the material cost of the silver electrode has exceeded half of the processing cost for manufacturing solar cells. With the state-of-the-art printing technology, the Ag lines typically have a line width between 100 and 120 microns, and it is difficult to reduce the line width further. Although inkjet printing can result in narrower lines, inkjet printing suffers other problems, such as low productivity. The height of the Ag lines is also limited by the printing method. One print can produce Ag lines with a height that is less than 25 microns. Although multiple printing can produce lines with increased height, it also increases line width, which is undesirable for high-efficiency solar cells. Similarly, electroplating of Ag or Cu onto the printed Ag lines can increase line height at the expense of increased line width. In addition, the resistance of such Ag lines is still too high to meet the requirement of high-efficiency solar cells.

Another solution is to electroplate a Ni/Cu/Sn metal stack directly on the Si emitter. This method can produce a metal grid with lower resistance (the resistivity of plated Cu is typically between $2 \times 10^{-6}$ and $3 \times 10^{-6}$ ohm-cm). However, the adhesion of Ni to Si is less than ideal, and stress from the metal stack may result in peeling of the whole metal lines.

SUMMARY

One embodiment of the present invention provides a solar cell. The solar cell includes a photovoltaic structure and a front-side metal grid situated above the photovoltaic structure. The front-side metal grid also includes one or more electroplated metal layers. The front-side metal grid also includes one or more finger lines, and each end of a respective finger line is coupled to a corresponding end of an adjacent finger line via an additional metal line, thus ensuring that the respective finger line has no open end.

In a variation on the embodiment, the additional metal line is located near an edge of the solar cell and has a width that is larger than a width of the respective finger line.

In a variation on the embodiment, an intersection between the additional metal line and the respective finger line is rounded or chamfered.

In a variation on the embodiment, the metal grid further includes a metal adhesive layer situated between the electroplated metal layer and the photovoltaic structure. The metal adhesive layer further comprises one or more of: Cu, Al, Co, W, Cr, Mo, Ni, Ti, Ta, titanium nitride ($TiN_x$), titanium tungsten ($TiW_x$), titanium silicide ($TiSi_x$), titanium silicon nitride (TiSiN), tantalum nitride ($TaN_x$), tantalum silicon nitride ($TaSiN_x$), nickel vanadium (NiV), tungsten nitride ($WN_x$), and their combinations.

In a further variation, the photovoltaic structure comprises a transparent conducting oxide (TCO) layer, and the metal adhesive layer is in direct contact with the TCO layer.

In a variation on the embodiment, the electroplated metal layers include one or more of: a Cu layer, an Ag layer, and a Sn layer.

In a variation on the embodiment, the metal grid further includes a metal seed layer situated between the electroplated metal layer and photovoltaic structure.

In a further variation, the metal seed layer is formed using a physical vapor deposition (PVD) technique, including one of: evaporation and sputtering deposition.

In a variation on the embodiment, a predetermined edge portion of the respective finger line has a width that is larger than a width of a center portion of the respective finger line.

In a variation on the embodiment, the photovoltaic structure includes a base layer, and an emitter layer situated above the base layer. The emitter layer includes at least one of: regions diffused with dopants located within the base layer, a poly silicon layer diffused with dopants situated above the base layer, and a doped amorphous silicon (a-Si) layer situated above the base layer.

In a further variation, the dopants include one of: phosphorus and boron.

BRIEF DESCRIPTION OF THE FIGURES

FIG. 5 presents a diagram illustrating an exemplary process of fabricating a solar cell in accordance with an embodiment of the present invention.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solution to avoid metal peeling in a solar cell that includes an electroplated metal grid. The solar cell includes a crystalline-Si (c-Si) substrate, an emitter layer, a passivation layer, a metal-adhesion layer, and front- and back-side electrode metal grids. The metal-adhesion layer is formed using a physical vapor deposition (PVD) technique, such as sputtering or evaporation. The front-side metal grid is formed by selectively electroplating a metal stack, which can be a single-layer or a multi-layer structure, on the metal-adhesion layer. To mitigate the stress that can lead to the peeling of the metal lines, the grid pattern is specially designed to ensure that no open end or discontinuous point exists. The back-side electrode metal grid can be formed using a same method that is used to form the front-side electrode metal grid. Additionally, it is possible to form the back-side electrode by screen-printing, electroplating, or aerosol-jet printing of a metal grid.

Electroplated Metal Grid

Electroplated metal grids used as solar cell electrodes have shown lower resistance than printed Al grids. However, adhesion between the electroplated metal lines and the underlying transparent conducting oxide (TCO) layers or semiconductor layers can be an issue. Even with the introduction of an adhesion layer, as the thickness of the electroplated metal lines increases (to ensure lower resistance), metal line peeling can still occur when the stress is to o high. The peeling of metal lines can be a result of stress buildup at the interface between the electroplated metal and the underlying structures (which can be the TCO layer or the semiconductor structure). The difference in thermal expansion coefficients between the metal and the silicon substrate and the thermal cycling of the environment where the solar cells are situated often lead to such stress. If the amount of the stress exceeds the adhesion strength provided by the adhesion layer, the bonding between the metal and the underlying layers will break.

Figure 2:
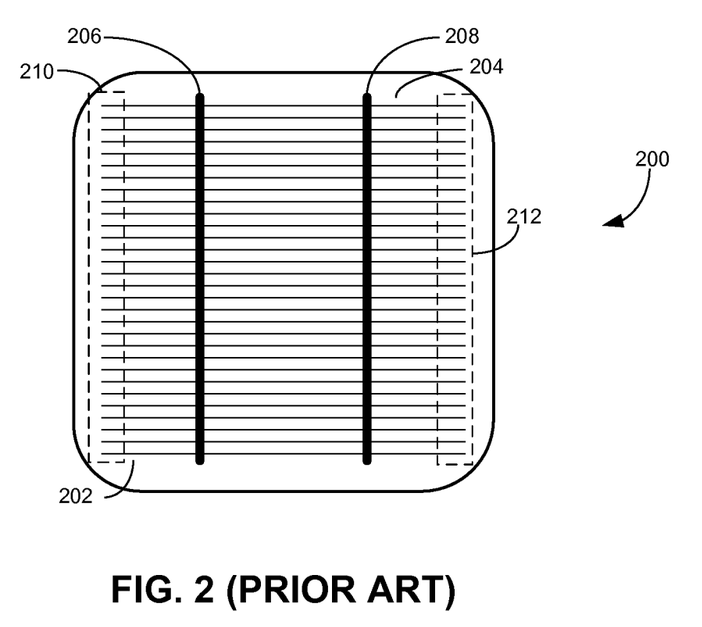
FIG. 2 presents a diagram illustrating an exemplary electroplated metal grid situated on the front surface of a solar cell (prior art).

FIG. 2 presents a diagram illustrating an exemplary electroplated metal grid situated on the front surface of a solar cell (prior art). In FIG. 2, metal grid 200 includes a number of finger strips, such as finger strips 202 and 204, and busbars 206 and 208. Note that busbars are thicker metal strips connected directly to external leads, and fingers are finer metal strips that collect photo current for delivery to the busbars.

When designing solar cells, to reduce losses due to emitter resistance and shading, it is desirable to design a high metal height-to-width aspect ratio. However, the height-to-width aspect ratio of the finger lines is often limited by the fabrication technology used for forming the metal grid. Conventional printing technologies, such as screen-printing, often result in metal lines with relatively low height-to-width aspect ratio. Electroplating technologies can produce metal lines with higher height-to-width aspect ratio. However, electroplated metal lines may experience peeling when placed in an environment with changing temperatures. As previously discussed, the difference in thermal expansion coefficients between the metal and the silicon substrate, and the changing temperature can lead to stress buildup and the eventual breaking of the adhesion between the metal and the underlying layers. Even though the breaking may happen at a single location, the good malleability of the plated metal, such as plated Cu, can lead to peeling of the entire metal line.

Note that the amount of stress is related to the height-to-width aspect ratio of the metal lines; the larger the aspect ratio, the larger the stress. Hence, assuming the metal lines have uniform width (which can be well controlled during fabrication), the thicker portion of the line will experience greater stress. For electroplated metal grid, due to the current crowding effect occurring at the edge of the wafer, metals deposited at the wafer edge tend to be thicker than metals deposited at the center of the wafer. In the example shown in FIG. 2, electroplated metals located in edge regions, such as regions 210 and 212, tend to have a larger thickness. As one can see from FIG. 2, conventional metal grid 200 includes finger strips that have open ends at edge regions 210 and 212. These end portions tend to have larger thicknesses and, thus, may experience larger amounts of thermal stress.

To make matters worse, in addition to thermal stress, additional handling of the devices during fabrication of the solar module, such as storing, tabbing, and stringing, can also lead to peeling of the metal grid. For example, while the solar cells are being handled by machines or people, it is possible that finger lines may be pushed from side to side by other objects, such as edges of different wafers or metal lines on a wafer stacked above. Coincidentally, the end portions of the finger strips are often the weakest point in terms of resisting external forces. As one can see in FIG. 2, the end portion of a finger strip is not connected to other portions of the metal line, and thus is less supported. While being pushed from side to side, it is easier for the end of a finger strip than the middle of the finger strip to break away from the underlying layers. Once the end portion breaks away, the good malleability of the metal often leads to the peeling of the entire metal line. Note that the metal peeling often happens to the finger strip due to its high height-to-width aspect ratio. The busbar, on the other hand, is much wider and usually does not experience peeling.

Hence, to prevent the peeling of the metal lines, it is important to strengthen the bond between the end portions of the finger strip and the underlying layers. Based on the previous analysis, to strengthen the bond between the metal at the line end and the underlying layers, one can reduce the height of the end portions to make it the same as the rest of the portions of the line. One way to do so is to increase the width of the line at the end region. The increased line width means that the collected current is now spread over a larger area, hence mitigating the current crowding at the line end. However, to avoid shading loss, the increase in line width has to be small, and the overall effect is limited. In addition, this still cannot prevent end peeling caused by external forces.

Figure 3A:
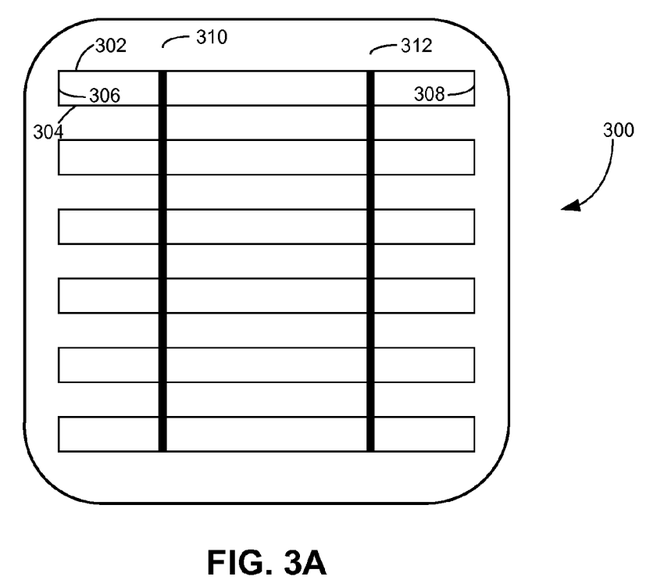
FIG. 3A presents a diagram illustrating an exemplary electroplated metal grid situated on the surface of a solar cell, in accordance with an embodiment of the present invention.

Embodiments of the present invention provide a solution that makes the finger strips more resistant to peeling by redesigning the grid pattern. FIG. 3A presents a diagram illustrating an exemplary electroplated metal grid situated on the surface of a solar cell, in accordance with an embodiment of the present invention. In FIG. 3A, metal grid 300 includes a number of horizontally oriented finger strips, such as finger strips 302 and 304, and busbars 310 and 312. However, unlike metal grid 200 where each finger strip is a line segment disconnected from other finger strips, in FIG. 3A, both end points of each finger strip are connected to end points of an adjacent finger strip. For example, the end points of finger strip 302 are connected to end points of finger strip 304 via two short lines 306 and 308.

Note that two goals can be simultaneously achieved by adding short lines that bridge two adjacent finger strips. The first goal is to divert current at the wafer edge during electroplating, thus reducing the thickness of the metal deposited at the ends of the finger strips. Compared with the example shown in FIG. 2, during the electroplating process where only the finger patterns are conductive, the added short lines, such as lines 306 and 308, can cause the current that was originally concentrated at the tips of the finger strips, such as finger strips 302 and 304, to be diverted away through these added short lines. Consequently, current densities at the tips of the finger strips are reduced. This can further lead to a more uniform height of the deposited metal. The increased height uniformity of the metal lines means that there will be less additional stress buildup at the ends of the finger strips when the temperature changes.

The second goal achieved by the additional short lines is to eliminate the existence of open ends. By bridging an open end point on one finger strip to an end point on an adjacent finger strip, the original discontinued finger strips become continuous lines without any open ends. Note that, as discussed previously, open or discontinued ends may break off when external forces are applied due to lack of structural support. In contrast, in the example shown in FIG. 3A, when external forces are applied to finger strip 302, such as when finger strip 302 is pushed from side to side, because the end portions are now connected to and supported by additional lines 306 and 308, it is less likely for the end portions of finger strip 302 to break away from the underlying layers. Note that the support to the end portions is provided by adhesion forces between those additional lines and the underlying layers. The elimination of the open ends also eliminates the weakest point in terms of resisting external forces. Note that because the metal peeling is not a concern for busbars, there is no need to eliminate the open ends on the busbars. In one embodiment, the ends of the busbars are configured to align with the finger strips at the upper and lower edge of the wafer, as shown in FIG. 3A. In other words, the ends of the busbars can merge into the end finger strips, which results in the busbars also have no open ends.

Figure 3B:
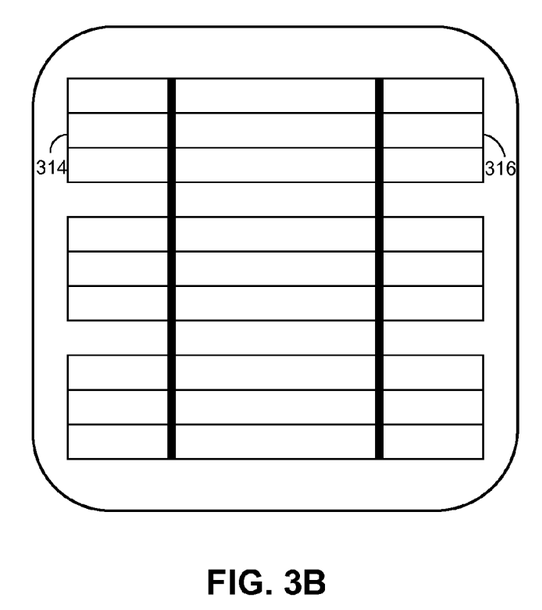
FIG. 3B presents a diagram illustrating an exemplary electroplated metal grid situated on the surface of a solar cell, in accordance with an embodiment of the present invention.

By simultaneously increasing thickness uniformity and eliminating open ends, embodiments of the present invention effectively reduce the possibility of peeling of the finger strips. In addition to the example shown in FIG. 3A, other grid patterns can also be used to reduce the chances of peeling as long as they add additional metal lines at the wafer edge and the fingers consist of continuous lines without any open ends. FIG. 3B presents a diagram illustrating an exemplary electroplated metal grid situated on the surface of a solar cell, in accordance with an embodiment of the present invention. In the example shown in FIG. 3B, instead of merely creating connections between two adjacent finger strips, short lines are added to connect the end points of more than two finger strips. In FIG. 3B, a number of short lines, such as lines 314 and 316, are added at the wafer edge to couple more than two finger strips. Like the one shown in FIG. 3A, the resulting grid pattern includes continuous finger lines that have no open ends.

Figure 3C:
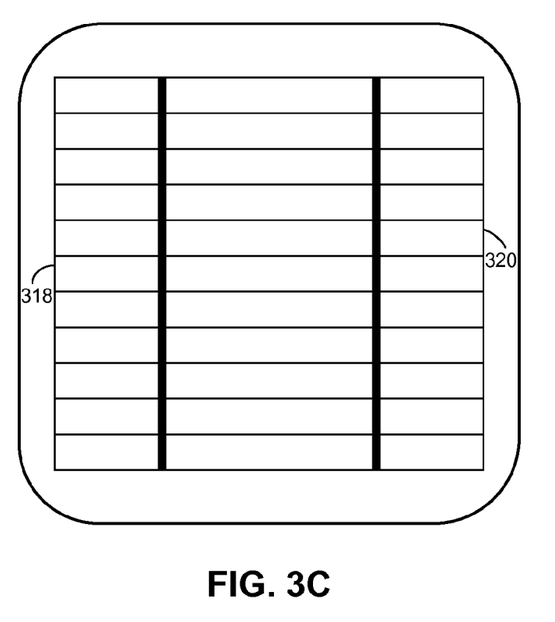
FIG. 3C presents a diagram illustrating an exemplary electroplated metal grid situated on the surface of a solar cell, in accordance with an embodiment of the present invention.
Figure 3D:
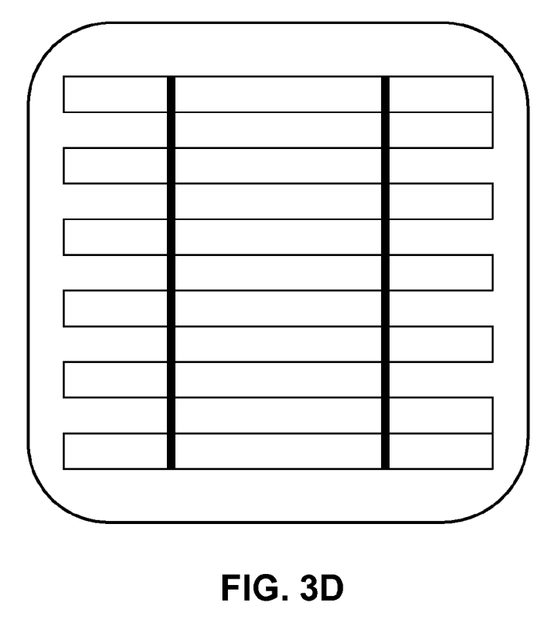
FIG. 3D presents a diagram illustrating an exemplary electroplated metal grid situated on the surface of a solar cell, in accordance with an embodiment of the present invention.

FIG. 3C presents a diagram illustrating an exemplary electroplated metal grid situated on the surface of a solar cell, in accordance with an embodiment of the present invention. In FIG. 3C, on each edge of the wafer, an vertically oriented long line, such as lines 318 and 320, is added to join together end points of all horizontally oriented finger strips. FIG. 3D presents a diagram illustrating an exemplary electroplated metal grid situated on the surface of a solar cell, in accordance with an embodiment of the present invention. In FIG. 3D, short lines are added alternatively (with the exception of the upper and lower edges) at the left and right edges of the wafer between two adjacent finger strips to ensure that each end point of a finger strip is at least coupled to an end point of an adjacent finger strip via a short metal line. Note that the finger patterns shown in FIGS. 3A-3D are merely examples, and they are not intended to be exhaustive or to limit the present invention to the finger patterns disclosed in these figures. Embodiments of the present invention can include any finger patterns that add metal lines at the wafer edge to connect the otherwise discrete finger strips. Such additional lines play important roles in mitigating the problem of metal peelings facing the electroplated metal grid because they help to divert current from and provide structural support to the end portions of the finger strips.

Note that, although the additional lines at the wafer edge may increase shading, such an effect can be negligible in most cases. For example, in FIG. 3A, the total effect of the additional lines can be equivalent to the addition of a single finger strip. For a wafer with a size of 125×125 mm$^2$, an additional finger strip with a width of about 75 µm only adds about 0.05% shading, which is negligible. Moreover, the additional shading may also be offset by the additional current collected by these additional lines.

Figure 4:
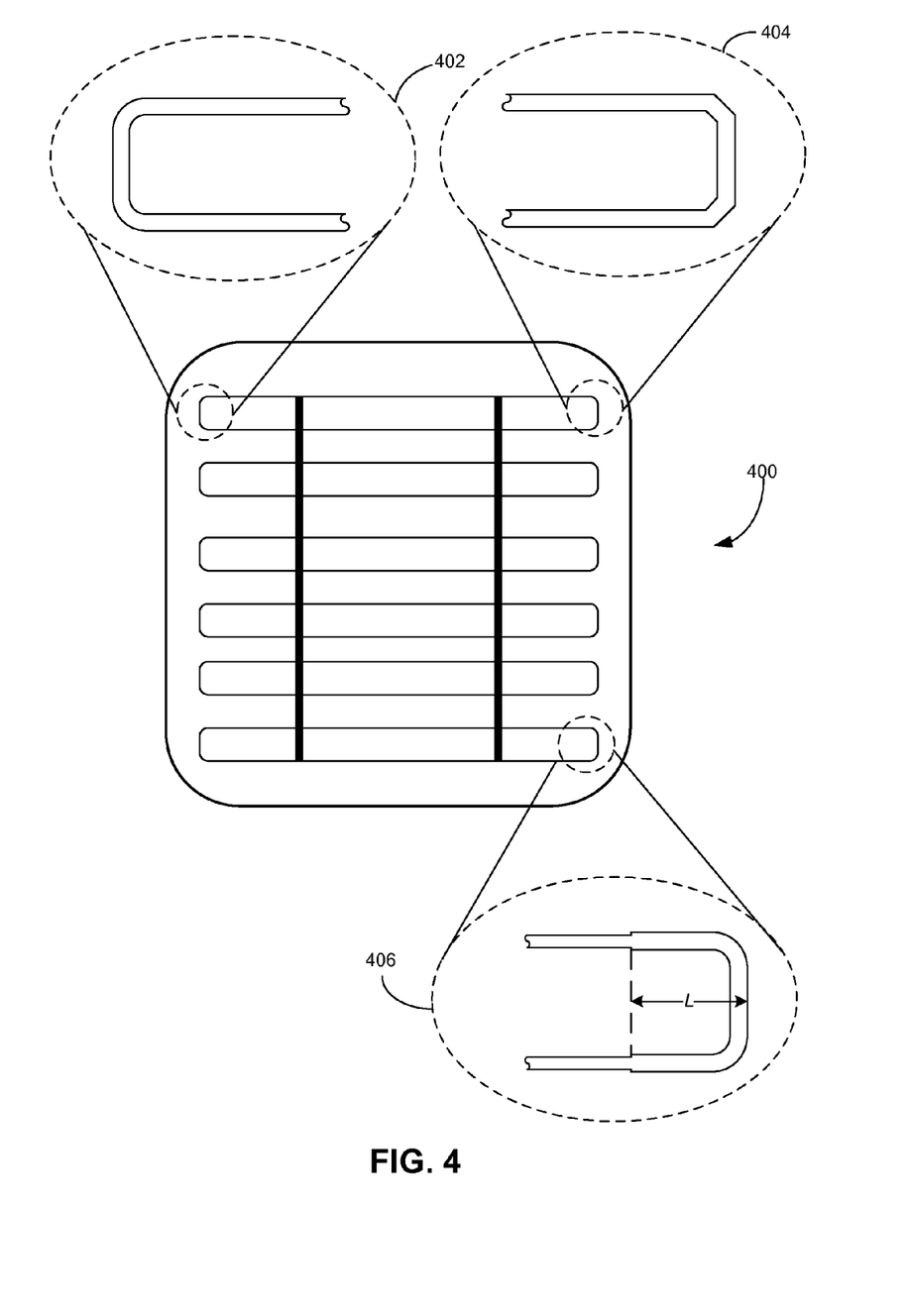
FIG. 4 presents a diagram illustrating an exemplary electroplated metal grid situated on the surface of a solar cell, in accordance with an embodiment of the present invention.

In the examples shown in FIGS. 3A-3D, sharp corners are created where the additional vertical lines connected to the horizontal finger strips. These sharp corners may also accumulate lateral stress that may cause metal breaking. To further improve the adhesion of the metal lines, in one embodiment, the finger strips are connected by lines with rounded corner. FIG. 4 presents a diagram illustrating an exemplary electroplated metal grid situated on the surface of a solar cell, in accordance with an embodiment of the present invention. In FIG. 4, metal grid 400 includes finger strips that include continuous, non-broken lines. More specifically, every two adjacent parallel finger strips are joined together at the ends by additional short lines to form a continuous loop. To further reduce the stress, straight angles or sharp turns are avoided when designing the finger patterns. For example, the straight angle can be rounded with an arc or chamfered with straight lines. In FIG. 4, regions 402 and 404 illustrate exemplary detailed views of the turning locations of a finger strip.

The detailed view shown in region 402 illustrates that arcs are used to connect two perpendicular metal lines, one being the horizontal finger strip, and the other the vertical short line that bridges two adjacent fingers. This results in a rounded corner. In one embodiment, the radius of the arc can be between 0.05 mm and one-half of the finger spacing. Note that the finger spacing can be between 2 and 3 mm. The detailed view shown in region 404 illustrates that chamfers are created at the turning corners to eliminate the right angle formed by the two perpendicular metal lines.

In one embodiment, the metal lines at the wafer edge, such as the short lines (including the rounded or chamfered sections) that connect the two adjacent finger strips, are slightly widened in order to further reduce current density at those locations. As a result, during electroplating, the thickness of metal deposited at those edge locations is reduced, and the increased contact area also ensures better adhesion between the electroplated metal and the underlying layers. In FIG. 4, region 406 illustrates an exemplary detailed view of the edge portions of a finger strip, showing that the width of the edge portion is larger than that of the center portion of the finger strip. In one embodiment, the width of the edge portion of the finger can be at least 20%-30% larger than that of the center portion. In a further embodiment, the width of the edge portion of the finger can be up to 0.2 mm. The length of this widened portion (denoted as L in FIG. 4) can be between 1 and 30 mm. Note that the longer the widened finger edge, the better the adhesion, and the more shading effect. In some embodiments, the interface between the center portion of the finger and the widened edge portion of the finger may be tapered.

FIG. 5 presents a diagram illustrating an exemplary process of fabricating a solar cell in accordance with an embodiment of the present invention.

Figure 5A:
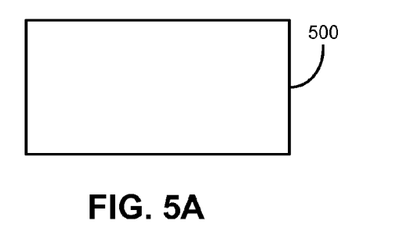
FIG. 5A illustrates a substrate.

In operation 5A, a substrate 500 is prepared. In one embodiment, substrate 500 can be a crystalline-Si (c-Si) wafer. In a further embodiment, preparing c-Si substrate 500 includes standard saw damage etch (which removes the damaged outer layer of Si) and surface texturing. The c-Si substrate 500 can be lightly doped with either n-type or p-type dopants. In one embodiment, c-Si substrate 500 is lightly doped with p-type dopants. Note that in addition to c-Si, other materials (such as metallurgical-Si) can also be used to form substrate 500.

Figure 5B:
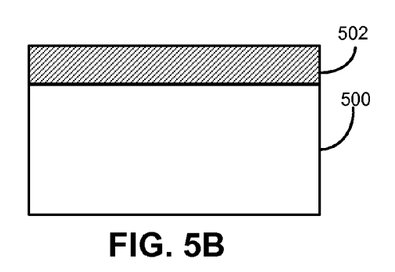
FIG. 5B illustrates an emitter layer formed on the substrate.

In operation 5B, a doped emitter layer 502 is formed on top of c-Si substrate 500. Depending on the doping type of c-Si substrate 500, emitter layer 502 can be either n-type doped or p-type doped. In one embodiment, emitter layer 502 is doped with n-type dopant. In a further embodiment, emitter layer 502 is formed by diffusing phosphorous. Note that if phosphorus diffusion is used for forming emitter layer 502, phosphosilicate glass (PSG) etch and edge isolation is needed. Other methods are also possible to form emitter layer 502. For example, one can first form a poly Si layer on top of substrate 500, and then diffuse dopants into the poly Si layer. The dopants can include either phosphorus or boron. Moreover, emitter layer 502 can also be formed by depositing a doped amorphous Si (a-Si) layer on top of substrate 500.

Figure 5C:
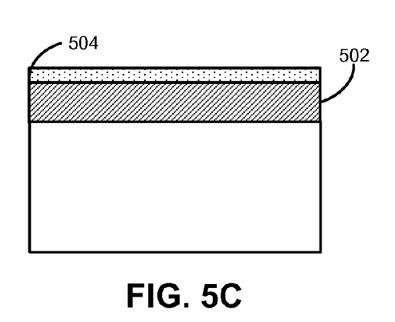
FIG. 5C illustrates an anti-reflection layer formed on top of the emitter layer.

In operation 5C, an anti-reflection layer 504 is formed on top of emitter layer 502. In one embodiment, anti-reflection layer 504 includes, but not limited to: silicon nitride ($SiN_x$), silicon oxide ($SiO_x$), titanium oxide ($TiO_x$), aluminum oxide ($Al_2O_3$), and their combinations. In one embodiment, anti-reflection layer 504 includes a layer of a transparent conducting oxide (TCO) material, such as indium tin oxide (ITO), aluminum zinc oxide (AZO), gallium zinc oxide (GZO), tungsten doped indium oxide (IWO), and their combinations.

Figure 5D:
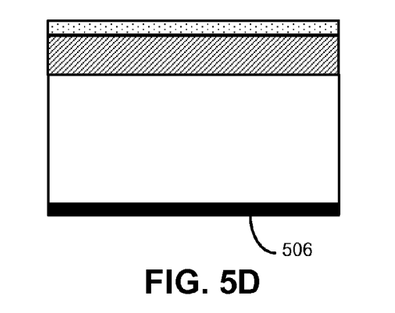
FIG. 5D illustrates a back-side electrode formed on the back side of the substrate.

In operation 5D, back-side electrode 506 is formed on the back side of Si substrate 500. In one embodiment, forming back-side electrode 506 includes printing a full Al layer and subsequent alloying through firing. In one embodiment, forming back-side electrode 506 includes printing an Ag/Al grid and subsequent furnace firing.

Figure 5E:
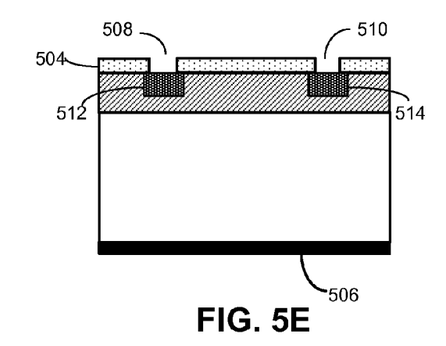
FIG. 5E illustrates a number of contact windows formed in the anti-reflection layer.

In operation 5E, a number of contact windows, including windows 508 and 510, are formed in anti-reflection layer 504. In one embodiment, heavily doped regions, such as regions 512 and 514 are formed in emitter layer 502, directly beneath contact windows 508 and 510, respectively. In a further embodiment, contact windows 508 and 510 and heavily doped regions 512 and 514 are formed by spraying phosphorous on anti-reflection layer 504, followed by a laser-groove local-diffusion process. Note that operation 5E is optional, and is needed when anti-reflection layer 504 is electrically insulating. If anti-reflection layer 504 is electrically conducting (e.g., when anti-reflection layer 504 is formed using TCO materials), there is no need to form the contact windows.

Figure 5F:
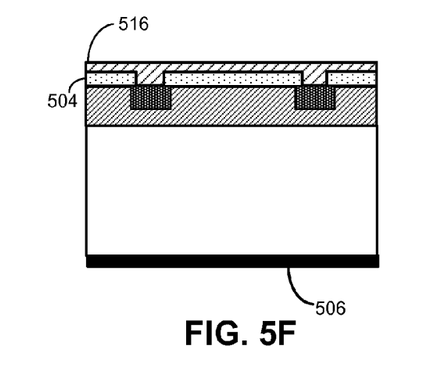
FIG. 5F illustrates a metal adhesive layer formed on top of the anti-reflection layer.

In operation 5F, a metal adhesive layer 516 is formed on anti-reflection layer 504. In one embodiment, materials used to form adhesive layer 516 include, but are not limited to: Ti, titanium nitride ($TiN_x$), titanium tungsten ($TiW_x$), titanium silicide ($TiSi_x$), titanium silicon nitride (TiSiN), Ta, tantalum nitride ($TaN_x$), tantalum silicon nitride ($TaSiN_x$), nickel vanadium (NiV), tungsten nitride ($WN_x$), Cu, Al, Co, W, Cr, Mo, Ni, and their combinations. In a further embodiment, metal adhesive layer 516 is formed using a physical vapor deposition (PVD) technique, such as sputtering or evaporation. The thickness of adhesive layer 516 can range from a few nanometers up to 100 nm. Note that Ti and its alloys tend to form very good adhesion with Si material, and they can form good ohmic contact with heavily doped regions 512 and 514. Forming metal adhesive layer 514 on top of anti-reflection layer 504 prior to the electroplating process ensures better adhesion to anti-reflection layer 504 of the subsequently formed layers.

Figure 5G:
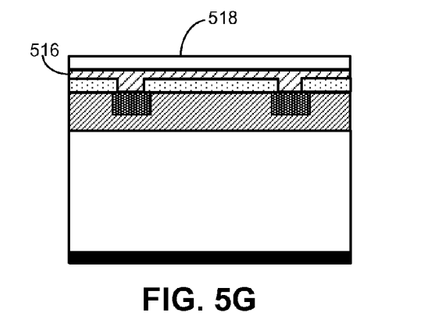
FIG. 5G illustrates a metal seed layer formed on the metal adhesive layer.

In operation 5G, a metal seed layer 518 is formed on adhesive layer 516. Metal seed layer 518 can include Cu or Ag. The thickness of metal seed layer 518 can be between 5 nm and 500 nm. In one embodiment, metal seed layer 518 has a thickness of 100 nm. Like metal adhesive layer 516, metal seed layer 518 can be formed using a PVD technique. In one embodiment, the metal used to form metal seed layer 518 is the same metal that used to form the first layer of the electroplated metal. The metal seed layer provides better adhesion of the subsequently plated metal layer. For example, Cu plated on Cu often has better adhesion than Cu plated on to other materials.

Figure 5H:
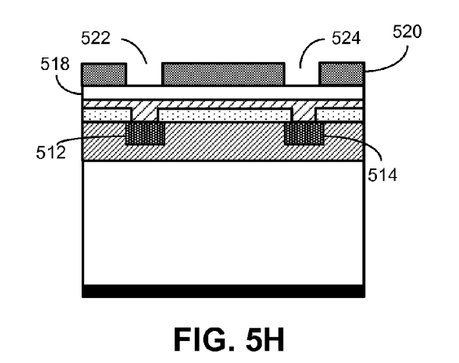
FIG. 5H illustrates a patterned masking layer formed on the metal seed layer.

In operation 5H, a patterned masking layer 520 is deposited on top of metal seed layer 518. The openings of masking layer 520, such as openings 522 and 524, correspond to the locations of contact windows 508 and 510, and thus are located above heavily doped regions 512 and 514. Note that openings 522 and 524 are slightly larger than contact windows 508 and 510. Masking layer 520 can include a patterned photoresist layer, which can be formed using a photolithography technique. In one embodiment, the photoresist layer is formed by screen-printing photoresist on top of the wafer. The photoresist is then baked to remove solvent. A mask is laid on the photoresist, and the wafer is exposed to UV light. After the UV exposure, the mask is removed, and the photoresist is developed in a photoresist developer. Openings 522 and 524 are formed after developing. The photoresist can also be applied by spraying, dip coating, or curtain coating. Dry film photoresist can also be used. Alternatively, masking layer 520 can include a layer of patterned silicon oxide ($SiO_2$). In one embodiment, masking layer 520 is formed by first depositing a layer of $SiO_2$ using a low-temperature plasma-enhanced chemical-vapor-deposition (PECVD) technique. In a further embodiment, masking layer 520 is formed by dip-coating the front surface of the wafer using silica slurry, followed by screen-printing an etchant that includes hydrofluoric acid or fluorides. Other masking materials are also possible, as long as the masking material is electrically insulating.

Figure 5I:
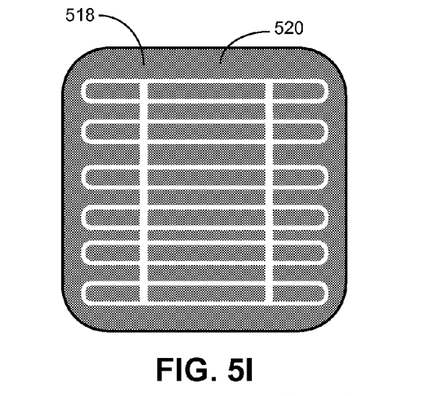
FIG. 5I illustrates a top view of the patterned masking layer.

Note that masking layer 520 defines the pattern of the front metal grid because, during the subsequent electroplating, metal materials can only be deposited on regions above the openings, such as openings 522 and 524, defined by masking layer 520. To ensure better thickness uniformity and better adhesion, the pattern defined by masking layer 520 includes finger strips that are formed with continuous, non-broken lines. Exemplary patterns formed by masking layer 520 include patterns shown in FIGS. 3A-3D. In a further embodiment, openings that define lines located close to the wafer edge are widened. Exemplary patterns at the wafer edge include patterns shown in FIG. 4. FIG. 5I illustrates a top view of the patterned masking layer in accordance with an embodiment of the present invention. As one can see in FIG. 5I, the shaded area on the surface of the wafer is covered with masking layer 520, hence is not electrically conductive. The openings expose the underlying metal seed layer 518, which is electrically conductive. In the exemplary pattern shown in FIG. 5I, openings with smaller width define the finger pattern, which includes continuous lines without any open end. On the other hand, openings with larger width define the busbars, which may include line segments with open ends because, for busbars, metal peeling is not a concern.

Figure 5J:
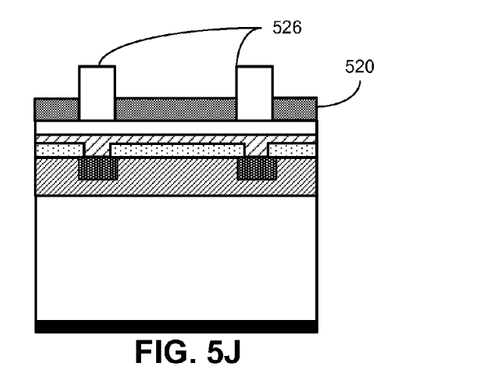
FIG. 5J illustrated a front-side metal grid deposited in the openings of the masking layer.

In operation 5J, one or more layers of metal are deposited at the openings of masking layer 520 to form a front-side metal grid 526. Front-side metal grid 526 can be formed using an electroplating technique, which can include electrodeposition, light-induced plating, and/or electroless deposition. In one embodiment, metal seed layer 518 and/or adhesive layer 516 are coupled to the cathode of the plating power supply, which can be a direct current (DC) power supply, via an electrode. Metal seed layer 518 and masking layer 520, which includes the openings, are submerged in an electrolyte solution which permits the flow of electricity. Note that, because masking layer 520 is electrically insulating, metals will be selectively deposited into the openings, thus forming a metal grid with a pattern corresponding to the one defined by those openings. Depending on the material forming metal seed layer 518, front-side metal grid 526 can be formed using Cu or Ag. For example, if metal seed layer 518 is formed using Cu, front-side metal grid 526 is also formed using Cu. In addition, front-side metal grid 526 can include a multilayer structure, such as a Cu/Sn bi-layer structure, or a Cu/Ag bi-layer structure. The Sn or Ag top layer is deposited to assist a subsequent soldering process. When depositing Cu, a Cu plate is used at the anode, and the solar cell is submerged in the electrolyte suitable for Cu plating. The current used for Cu plating is between 0.1 ampere and 2 amperes for a wafer with a dimension of 125 mm×125 mm, and the thickness of the Cu layer is approximately tens of microns. In one embodiment, the thickness of the electroplated metal layer is between 30 μm and 50 μm.

Figure 5K:
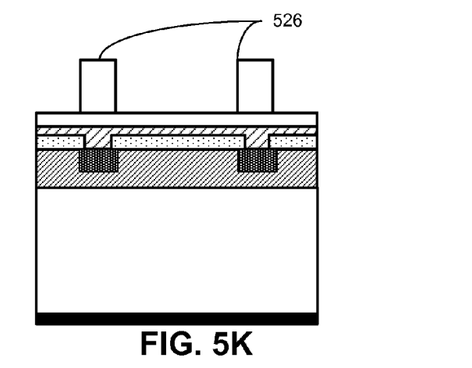
FIG. 5K illustrates the solar cell with the masking layer removed.

In operation 5K, masking layer 520 is removed.

Figure 5L:
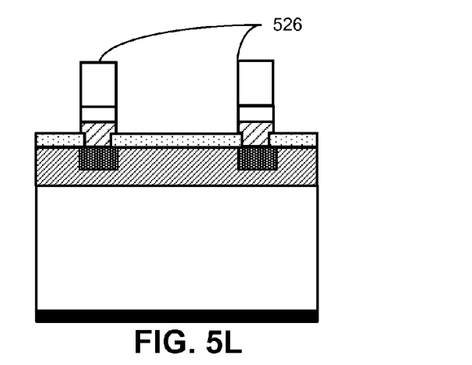
FIG. 5L illustrates the solar cell with portions of the metal adhesive layer and the metal seed layer etched away.

In operation 5L, portions of adhesive layer 516 and metal seed layer 518 that are originally covered by masking layer 520 are etched away, leaving only the portions that are beneath front-side metal grid 526. In one embodiment, wet chemical etching process is used. Note that, because front-side metal grid 526 is much thicker (by several magnitudes) than adhesive layer 516 and metal seed layer 518, the etching has a negligible effect on front-side metal grid 526. In one embodiment, the thickness of the resulting metal grid can range from 30 μm to 50 μm. The width of the finger strips can be between 10 μm to 100 μm, and the width of the busbars can be between 0.5 to 2 mm. Moreover, the spacing between the finger strips can be between 2 mm and 3 mm.

During fabrication, after the formation of the metal adhesive layer and the seed metal layer, it is also possible to form a patterned masking layer that covers areas that correspond to the locations of contact windows and the heavily doped regions, and etch away portions of the metal adhesive layer and the metal seed layer that are not covered by the patterned masking layer. In one embodiment, the leftover portions of the metal adhesive layer and the metal seed layer form a pattern that is similar to the ones shown in FIGS. 3A-3D and FIG. 4. Note that such patterns include finger strips that consist of continuous, non-broken lines. Once the patterned masking layer is removed, one or more layers of metals can be electroplated to the surface of the solar cell. On the solar cell surface, only the locations of the leftover portions of the metal seed layer are electrically conductive, a plating process can selectively deposit metals on top of the leftover portions of metal seed layer.

In the example shown in FIG. 5, the back-side electrode is formed using a conventional printing technique (operation 5D). In practice, the back-side electrode can also be formed by electroplating one or more metal layers on the backside of the solar cell. In one embodiment, the back-side electrode can be formed using operations that are similar to operations 5F-5L, which include forming a metal adhesive layer, a metal seed layer, and a patterned masking layer on the backside of the substrate. Note that the patterned masking layer on the backside defines the pattern of the back-side metal grid. In one embodiment, the back-side metal grid includes finger strips that are formed with continuous, non-broken lines. In a further embodiment, the back-side metal grid may include exemplary patterns shown in FIGS. 3A-3D and FIG. 4.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
   a photovoltaic structure; and
   a first metallic grid positioned on a first side of the photovoltaic structure, wherein the first metallic grid includes one or more finger lines, wherein ends of a first finger line are coupled to corresponding ends of an adjacent finger line via two metal lines, wherein the first finger line, the adjacent finger line, and the metal lines form a loop.

2. The solar cell of claim 1, wherein a respective metal line is located near an edge of the solar cell, and wherein the metal line has a width that is larger than a width of the first finger line.

3. The solar cell of claim 1, wherein the first metallic grid further includes one or more electroplated metal layers and a metal adhesive layer situated between the electroplated metal layers and the photovoltaic structure, wherein the metal adhesive layer further comprises one or more of: Cu, Al, Co, W, Cr, Mo, Ni, Ti, Ta, titanium nitride, titanium tungsten, titanium silicide, titanium silicon nitride, tantalum nitride, tantalum silicon nitride, nickel vanadium, tungsten nitride, and their combinations.

4. The solar cell of claim 3, wherein the photovoltaic structure comprises a transparent conductive oxide layer, and wherein the metal adhesive layer is in direct contact with the transparent conductive oxide layer.

5. The solar cell of claim 3, wherein the electroplated metal layers include one or more of:
   a Cu layer;
   an Ag layer; and
   a Sn layer.

6. The solar cell of claim 3, wherein the first metallic grid further includes a metal seed layer positioned between the electroplated metal layers and photovoltaic structure.

7. The solar cell of claim 6, wherein the metal seed layer is formed using a physical vapor deposition (PVD) technique, including one of: evaporation and sputtering deposition.

8. The solar cell of claim 1, wherein a predetermined edge portion of the first finger line has a width that is larger than a width of a center portion of the first finger line.

9. The solar cell of claim 1, wherein the photovoltaic structure includes:
   a base layer comprising Si; and
   an emitter layer positioned on a first side of the base layer, wherein the emitter layer includes at least one of:
      regions diffused with dopants located within the base layer;
      a poly Si layer diffused with dopants positioned on the first side of the base layer; and
      a doped amorphous Si (a-Si) layer positioned on the first side of the base layer.

10. The solar cell of claim 9, wherein the dopants include one of:
    phosphorus; and
    boron.

11. The solar cell of claim 1, further comprising a second metallic grid positioned on a second side of the photovoltaic structure, wherein the second metallic grid includes one or more electroplated metal layers, wherein the second metallic grid includes one or more finger lines, and wherein an end of a second finger line is coupled to a corresponding end of an adjacent finger line via a second metal line, thus ensuring that the second finger line has no open end.

12. A metallic grid for collecting current from a photovoltaic structure, comprising:
    a first finger line positioned on a first surface of the photovoltaic structure;
    a second finger line positioned on the first surface of the photovoltaic structure, wherein the second finger line is substantially parallel to the first finger line; and
    short metal lines connecting ends of the first finger line to corresponding ends of the second finger line,
       wherein the first finger line, the second finger line, and the short metal lines form a loop.

13. The metallic grid of claim 12, wherein a respective short metal line is located near an edge of the photovoltaic structure, and wherein the short metal line has a width that is larger than a width of the first finger line.

14. The metallic grid of claim 12, wherein the first and second finger lines include one or more electroplated metal layers and a metal adhesive layer situated between the electroplated metal layers and the photovoltaic structure, wherein the metal adhesive layer further comprises one or more of: Cu, Al, Co, W, Cr, Mo, Ni, Ti, Ta, titanium nitride, titanium tungsten, titanium silicide, titanium silicon nitride, tantalum nitride, tantalum silicon nitride, nickel vanadium, tungsten nitride, and their combinations.

15. The metallic grid of claim 14, wherein the electroplated metal layers include one or more of:
    a Cu layer;
    an Ag layer; and
    a Sn layer.

16. The metallic grid of claim 12, wherein a predetermined edge portion of the first finger line has a width that is larger than a width of a center portion of the first finger line.

17. The solar cell of claim 1, wherein an intersection between a respective metal line and the first finger line is rounded or chamfered.

18. The metallic grid of claim 12, wherein an intersection between a respective short metal line and the first finger line is rounded or chamfered.

* * * * *